(12) United States Patent
Cho et al.

(10) Patent No.: US 12,176,262 B2
(45) Date of Patent: Dec. 24, 2024

(54) SEMICONDUCTOR PACKAGE

(71) Applicant: SAMSUNG ELECTRONICS CO., LTD., Suwon-si (KR)

(72) Inventors: Eunseok Cho, Anyang-si (KR); Minjeong Gu, Anyang-si (KR); Joonsung Kim, Suwon-si (KR); Jaehoon Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/475,926

(22) Filed: Sep. 27, 2023

(65) Prior Publication Data

US 2024/0030089 A1    Jan. 25, 2024

Related U.S. Application Data

(63) Continuation of application No. 17/354,291, filed on Jun. 22, 2021, now Pat. No. 11,798,862.

(30) Foreign Application Priority Data

Oct. 7, 2020    (KR) .......................... 10-2020-0129209

(51) Int. Cl.
*H01L 23/367*    (2006.01)
*H01L 21/48*    (2006.01)
(Continued)

(52) U.S. Cl.
CPC ...... *H01L 23/3675* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS 7,557,014 B2    7/2009    Okamoto et al.
8,198,140 B2    6/2012    Murai et al.
(Continued)

FOREIGN PATENT DOCUMENTS

JP    2020-88069 A    6/2020

*Primary Examiner* — Long Pham
(74) *Attorney, Agent, or Firm* — Sughrue Mion, PLLC

(57) ABSTRACT

A method of manufacturing a semiconductor package is provided and includes: forming a lower redistribution structure, the lower redistribution structure including lower redistribution patterns having lower connection pads; forming an upper redistribution structure on a boundary surface of the lower redistribution structure, the upper redistribution structure including upper redistribution patterns having upper connection pads electrically connected to the lower connection pads; forming openings exposing at least a portion of each of the lower connection pads; disposing an interposer substrate, including the lower redistribution structure and the upper redistribution structure, on a base substrate, the lower connection pads of the interposer substrate electrically connected to wiring patterns of the base substrate through lower connection bumps disposed on the openings; and disposing at least one of semiconductor chips, including connection pads, on the interposer substrate, the connection pads electrically connected to the upper connection pads through upper connection bumps.

16 Claims, 17 Drawing Sheets

(51) Int. Cl.
*H01L 21/56* (2006.01)
*H01L 23/00* (2006.01)
*H01L 23/31* (2006.01)
*H01L 23/498* (2006.01)
*H01L 23/552* (2006.01)
*H01L 25/065* (2023.01)
*H01L 25/18* (2023.01)

(52) U.S. Cl.
CPC ........ *H01L 21/486* (2013.01); *H01L 21/4871* (2013.01); *H01L 21/563* (2013.01); *H01L 23/3185* (2013.01); *H01L 23/49816* (2013.01); *H01L 23/49822* (2013.01); *H01L 23/49827* (2013.01); *H01L 23/49833* (2013.01); *H01L 23/49838* (2013.01); *H01L 23/552* (2013.01); *H01L 24/16* (2013.01); *H01L 25/0655* (2013.01); *H01L 25/18* (2013.01); *H01L 2224/16227* (2013.01); *H01L 2924/1431* (2013.01); *H01L 2924/1434* (2013.01); *H01L 2924/1616* (2013.01); *H01L 2924/18161* (2013.01); *H01L 2924/19105* (2013.01); *H01L 2924/30111* (2013.01); *H01L 2924/3025* (2013.01)

(56) References Cited

U.S. PATENT DOCUMENTS

| | | | |
|---|---|---|---|
| 8,373,069 | B2 | 2/2013 | Kariya et al. |
| 9,455,219 | B2* | 9/2016 | Shimizu ............ H01L 23/49822 |
| 9,620,494 | B2* | 4/2017 | Son .................... H01L 24/73 |
| 9,673,148 | B2 | 6/2017 | Hu |
| 9,741,664 | B2 | 8/2017 | Chiu et al. |
| 9,935,046 | B1 | 4/2018 | Hung |
| 10,085,341 | B2 | 9/2018 | Roy et al. |
| 10,128,198 | B2* | 11/2018 | Yen .................... H01L 21/486 |
| 10,283,492 | B2 | 5/2019 | Gamini |
| 10,535,608 | B1 | 1/2020 | Rubin et al. |
| 10,692,847 | B2* | 6/2020 | Sobieski ............ H01L 23/5385 |
| 11,476,184 | B2* | 10/2022 | Ting .................. H01L 23/49822 |
| 2014/0217610 | A1* | 8/2014 | Jeng .................... H01L 21/4857 257/774 |
| 2019/0287872 | A1* | 9/2019 | Goh .................... H01L 23/5383 |
| 2020/0286847 | A1* | 9/2020 | Liu .................... H01L 21/6835 |
| 2021/0384120 | A1* | 12/2021 | Liu .................... H01L 25/16 |
| 2021/0407962 | A1* | 12/2021 | Kim .................... H01L 23/5385 |

* cited by examiner

SEMICONDUCTOR PACKAGE

CROSS-REFERENCE TO THE RELATED APPLICATION

This application is a continuation of U.S. application Ser. No. 17/354,291, filed on Jun. 22, 2021, which claims priority and benefit of Korean Patent Application No. 10-2020-0129209, filed on Oct. 7, 2020, with the Korean Intellectual Property Office, the contents of which are incorporated by reference herein in their entireties.

BACKGROUND

1. Field

Embodiments of the present disclosure relate to a semiconductor package.

2. Description of Related Art

In accordance with the trend for higher performance in semiconductor chips, in the semiconductor packaging field, a system-in-package (SIP) technology for mounting a plurality of semiconductor chips on a large-area package substrate is being developed. In this case, there is a need for a technique of forming a wiring for use with a fine bump pitch of a semiconductor chip on a substrate for a large-area package.

SUMMARY

According to an aspect of the present disclosure a semiconductor package having reduced manufacturing costs and an excellent yield is provided.

According to one or more embodiments, a method of manufacturing a semiconductor package is provided and includes: forming a lower redistribution structure on a first carrier, the lower redistribution structure including a plurality of lower redistribution patterns having lower connection pads; forming a protective insulating layer covering the lower connection pads; attaching the lower redistribution structure on a second carrier so that a boundary surface, on which the plurality of lower redistribution patterns is exposed after removing the first carrier, faces upward; forming an upper redistribution structure on the boundary surface of the lower redistribution structure, the upper redistribution structure including a plurality of upper redistribution patterns having upper connection pads electrically connected to the lower connection pads, wherein a first width of each of the lower connection pads is greater than a second width of each of the upper connection pads; forming openings exposing at least a portion of each of the lower connection pads from the protective insulating layer; disposing an interposer substrate, including the lower redistribution structure and the upper redistribution structure, on a base substrate including a plurality of wiring patterns having lower wiring pads, the lower connection pads of the interposer substrate electrically connected to the plurality of wiring patterns of the base substrate through lower connection bumps disposed on the openings, wherein a third width of each of the lower wiring pads is greater than the first width of each of the lower connection pads; and disposing at least one of semiconductor chips, including connection pads, on the interposer substrate, the connection pads electrically connected to the upper connection pads of the interposer substrate through upper connection bumps.

BRIEF DESCRIPTION OF DRAWINGS

The above and other aspects, features, and advantages of embodiments of the present disclosure will be more clearly understood from the following detailed description taken in conjunction with the accompanying drawings, in which.

DETAILED DESCRIPTION

Hereinafter, non-limiting example embodiments of the present disclosure will be described with reference to the accompanying drawings as follows.

Figure 1A:
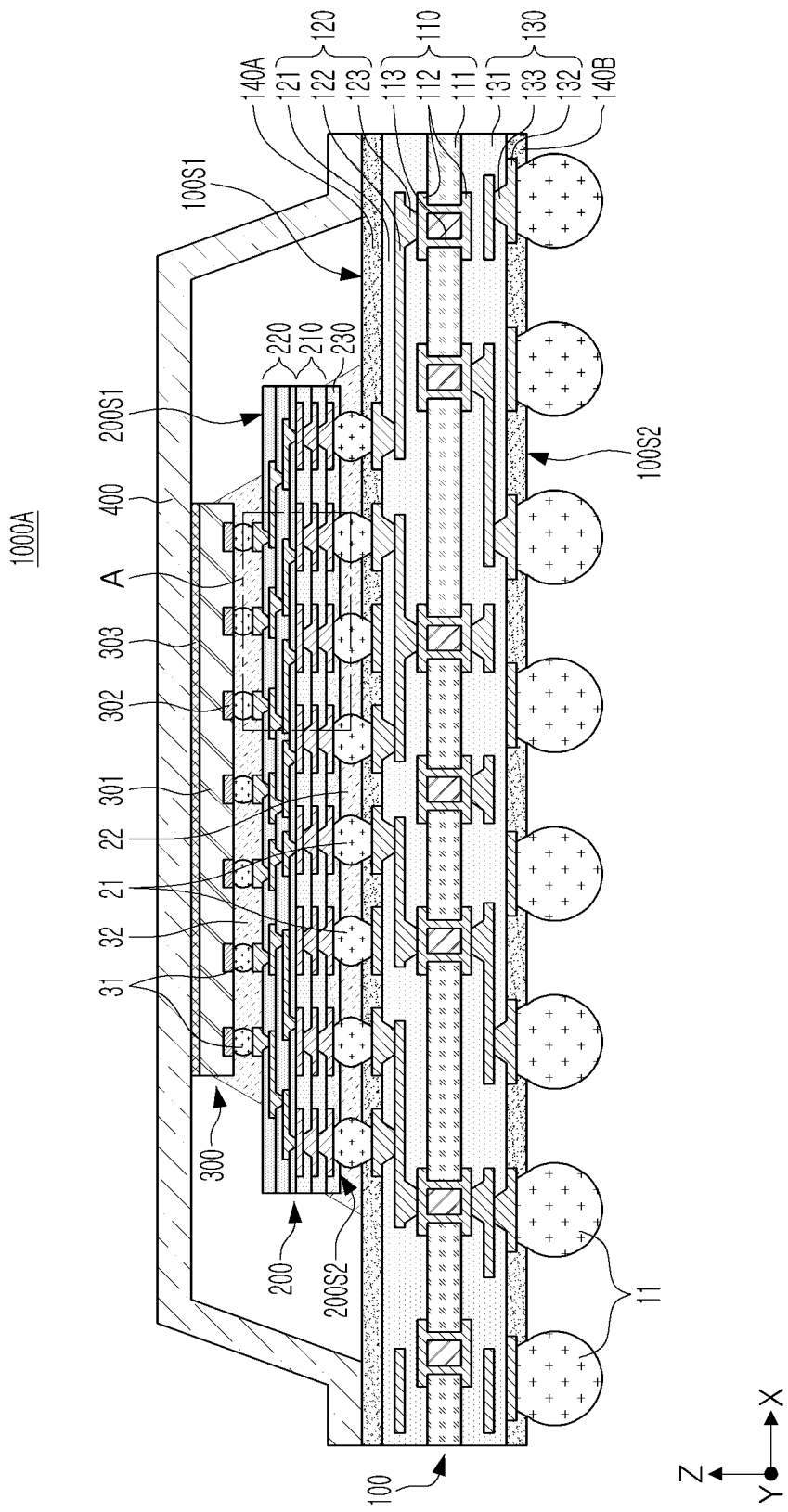
FIG. 1A is a cross-sectional diagram illustrating a semiconductor packaging according to an example embodiment of the present disclosure.
Figure 1B:
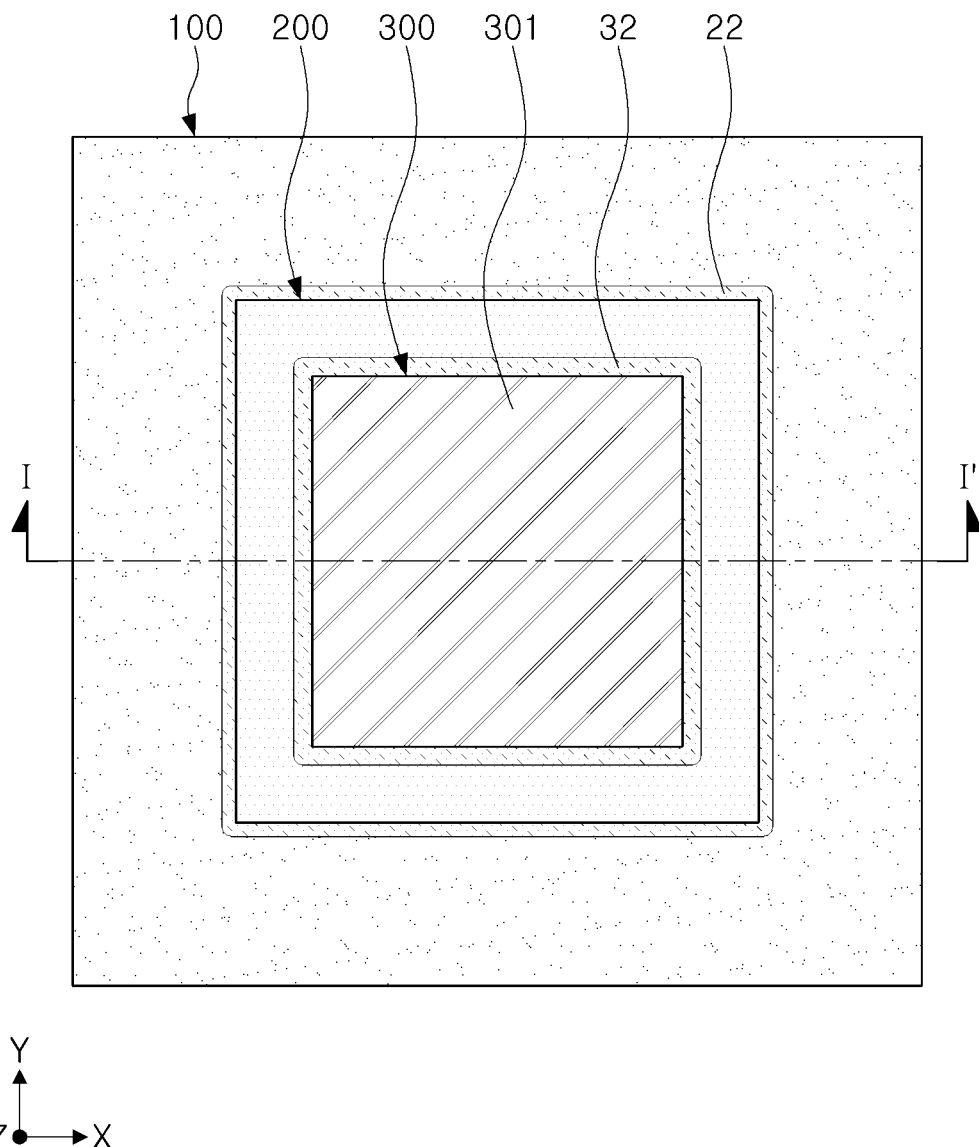
FIG. 1B is a plan diagram illustrating the semiconductor packaging according to the example embodiment of the present disclosure.
Figure 1C:
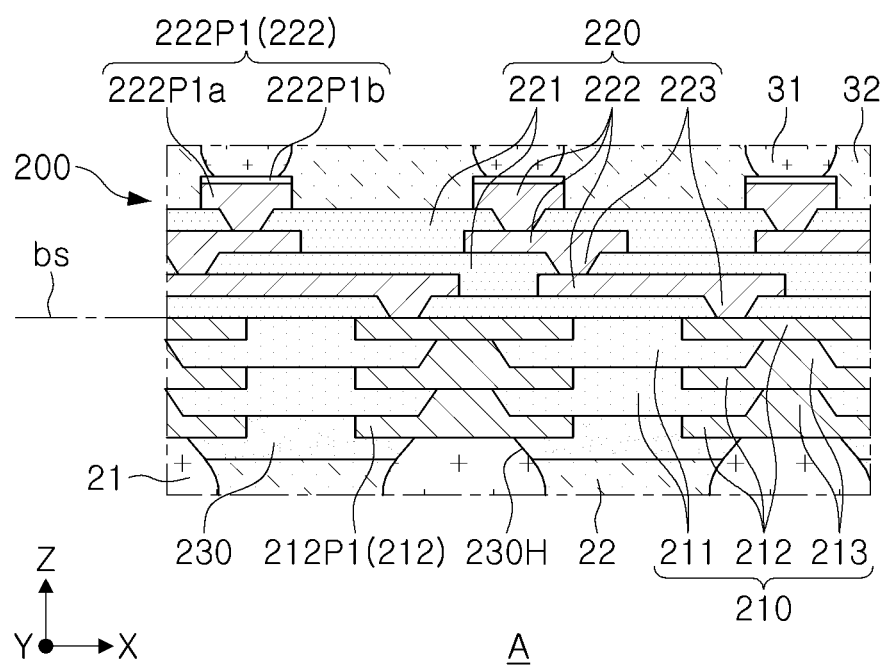
FIG. 1C is a partially enlarged cross-sectional view of the semiconductor packaging according to the example embodiment of the present disclosure.
Figure 2A:
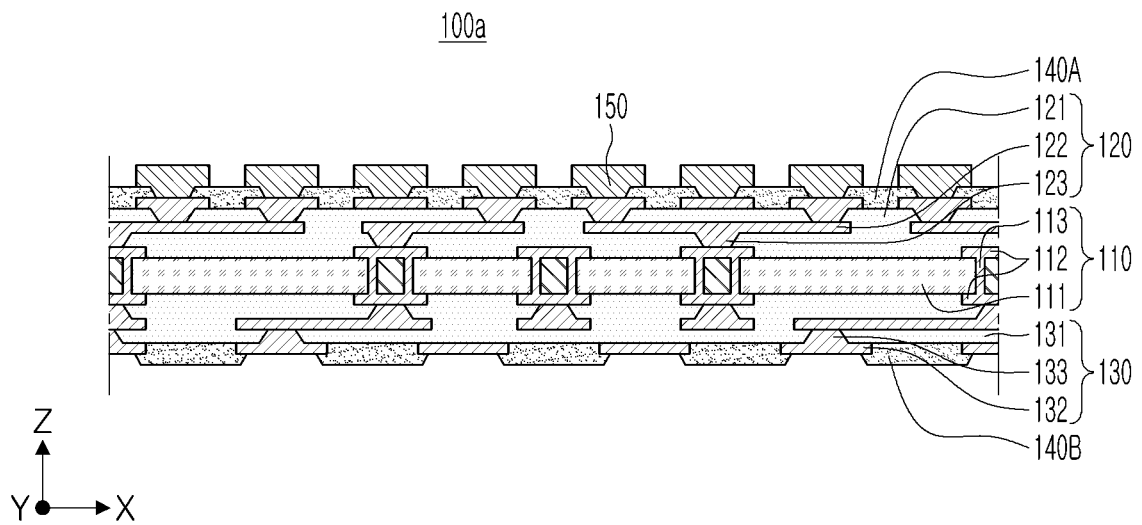
FIG. 2A is a cross-sectional diagram illustrating a first modified example of the base substrate of FIG. 1A.
Figure 2B:
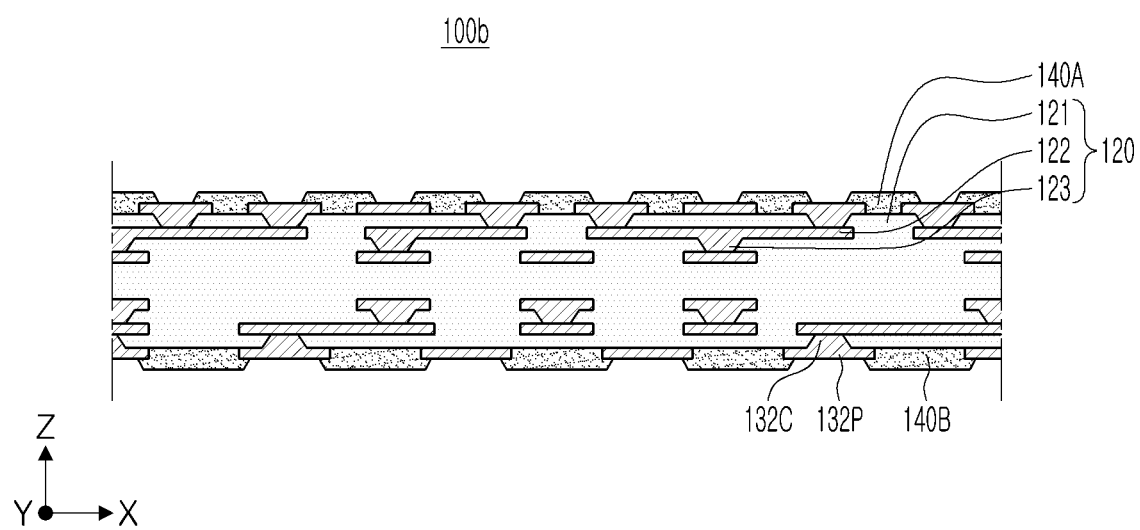
FIG. 2B is a cross-sectional diagram illustrating a second modified example of the base substrate of FIG. 1A.
Figure 3A:
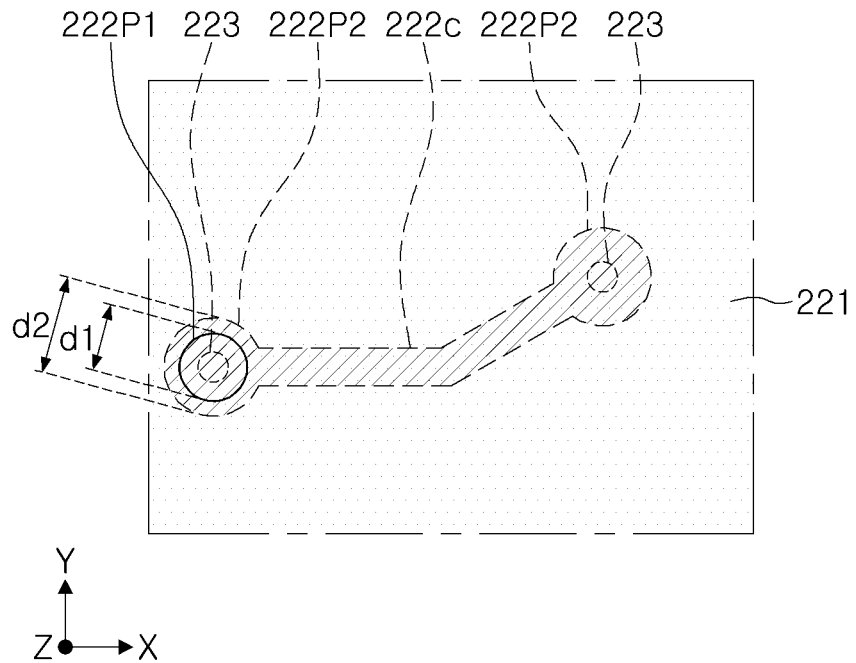
FIG. 3A is a first partially enlarged plan diagram illustrating some components of the interposer substrate of FIGS. 1A and 1C.
Figure 3B:
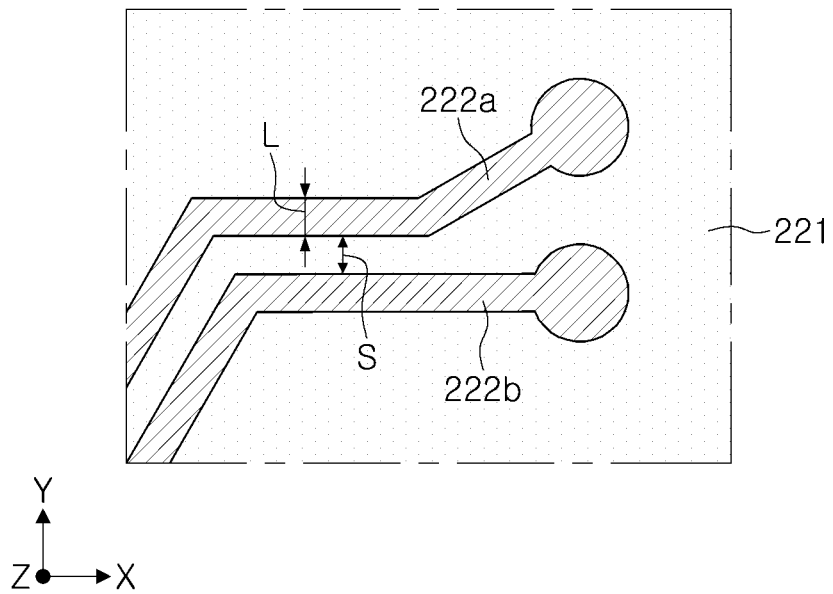
FIG. 3B is a second partially enlarged plan diagram illustrating some components of the interposer substrate of FIGS. 1A and 1C.

FIGS. 1A to 1C are a cross-sectional diagram, a plan diagram, and a partially enlarged diagram illustrating a semiconductor package 1000A according to an example embodiment of the present disclosure, and FIGS. 2A and 2B are cross-sectional diagrams illustrating a modified example of the base substrate 100 of FIG. 1, FIGS. 3A and 3B are partially enlarged plan diagrams illustrating some of the components of the interposer substrate 200 of FIG. 1, and FIGS. 4A to 4D are cross-sectional diagrams schematically illustrating a manufacturing process of the interposer substrate 200 of FIG. 1. FIG. 1A is a cross-sectional diagram taken along line I-I' of FIG. 1B. FIG. 1C is an enlarged diagram of area "A" of FIG. 1.

Referring to FIGS. 1A to 1C, a semiconductor package 1000A according to an example embodiment may include a base substrate 100, an interposer substrate 200, and a semiconductor chip (or a semiconductor structure) 300. In addition, the semiconductor package 1000A may further include a heat dissipation structure 400 covering the interposer substrate 200, and the semiconductor chip 300.

The base substrate 100 may be a support substrate on which the interposer substrate 200, the semiconductor chip 300, and the heat dissipation structure 400 are mounted, and may be a package substrate including a wiring circuit electrically connected to a redistribution circuit of the interposer substrate 200 and a connection pad of the semiconductor chip 300. The package substrate may include a printed circuit board (PCB), a ceramic substrate, a glass substrate, a tape wiring board, and the like.

The base substrate 100 may be a large-area substrate on which the interposer substrate 200 and the semiconductor chip 300 are mounted. Horizontal and vertical widths of the base substrate 100 may be 40 mm or more, respectively. For example, a minimum width of the base substrate 100 may be in a range of about 40 mm to about 80 mm. Horizontal and vertical widths of the interposer substrate 200 and the semiconductor chip 300 mounted on the base substrate 100 may be 10 mm or more, respectively. For example, minimum widths of the interposer substrate 200 and the semiconductor chip 300 may range from about 10 mm to 30 mm.

The base substrate 100 may have an upper surface 100S1 and a lower surface 100S2, opposite to each other, and may include a core substrate portion 110, an upper substrate portion 120, a lower substrate portion 130, the upper cover layer 140A, and the lower cover layer 140B. The base substrate 100 may include a wiring circuit including wiring patterns and wiring vias between the upper surface 100S1 and the lower surface 100S2.

The core substrate portion 110 may include a core insulating layer 111, a plurality of a core wiring pattern 112 disposed on both surfaces (upper and lower surfaces) of the core insulating layer 111, and a through-via 113 penetrating through the core insulating layer 111 and connecting the plurality of the core wiring pattern 112 to each other. The core substrate portion 110 may have a multilayer core substrate structure in which a plurality of the core insulating layer 111 are stacked according to a design of a wiring circuit.

The core insulating layer 111 may suppress warpage of the substrate by improving rigidity of the substrate. The thickness of the core insulating layer 111 may be greater than the thickness of each of the upper build-up insulating layer 121 and the lower build-up insulating layer 131. The core insulating layer 111 may include, for example, a thermosetting resin such as an epoxy resin, a thermoplastic resin such as polyimide, or, a prepreg including an inorganic filler and/or glass fibers, an Ajinomoto Build-up Film (ABF), a FR-4, a Bismaleimide Triazine (BT), and an Epoxy Molding Compound (EMC). The core insulating layer 111 may be formed using, for example, a copper clad laminate (CCL), an unclad copper clad laminate (CCL), a glass substrate, a ceramic substrate, or the like.

The plurality of the core wiring pattern 112 may include a conductive material, for example, at least one metal of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or an alloy containing two or more metals. The plurality of the core wiring pattern 112 may include ground (GND) patterns, power (PWR) patterns, signal (S) patterns, and the like, depending on the design.

The through-via 113 may be formed such that a via hole penetrating through the core insulating layer 111 is completely filled with a conductive material, or the conductive material is formed to be conformal along a wall of the via hole. When the through-via 113 is formed such that the conductive material is formed along the wall of the via hole, a space inside the via hole may be filled with an insulating material such as an epoxy resin, or the like.

The upper substrate portion 120 may include an upper build-up insulating layer 121 stacked on an upper surface of the core insulating layer 111, an upper wiring pattern 122 disposed on the upper build-up insulating layer 121, and an upper wiring via 123 penetrating through the upper build-up insulating layer 121 and connecting the upper wiring pattern 122 and the core wiring pattern 112.

The upper build-up insulating layer 121 may have a structure in which a plurality of the core insulating layer 111 formed of an insulating material are stacked in a vertical direction (a Z-axis direction). The plurality of insulating layers may be integrated such that boundaries between each of the plurality of insulating layers may not be clear. The insulating material may include, for example, a thermosetting resin such as an epoxy resin, a thermoplastic resin such as polyimide, or a prepreg including an inorganic filler and/or glass fibers, an Ajinomoto Build-up Film (ABF), a FR-4, and the like.

The upper wiring pattern 122 may include a plurality of upper wiring patterns, disposed on different levels. The upper wiring pattern 122 may be electrically connected to at least one of the core wiring pattern 112 and the lower wiring pattern 132. The upper wiring pattern 122 may include a ground pattern, a power pattern, a signal pattern, and the like, like the core wiring pattern 112. The upper wiring pattern 122 may include one of the conductive materials described above.

The upper wiring via 123 may penetrate through at least a portion of the upper build-up insulating layer 121 and connect the upper wiring patterns, disposed in different layers, or the upper wiring pattern 122 and the core wiring pattern 112. The upper wiring via 123 may include a conductive material, similar to the upper wiring pattern 122. The upper wiring via 123 may have a form of a filled via, in which the interior of the via hole is filled with a metal material, or a form of a conformal via, in which a metal material is formed along an inner wall of the via hole.

The lower substrate portion 130 may include a lower build-up insulating layer 131 stacked on a lower surface of the core insulating layer 111, a lower wiring pattern 132 disposed on the lower build-up insulating layer 131, and a lower wiring via 133 penetrating through the lower build-up insulating layer 131 and connecting the lower wiring pattern 132 and the core wiring pattern 112. Since the lower substrate portion 130 has technical characteristics similar to those of the upper substrate portion 120, descriptions of the lower build-up insulating layer 131, the lower wiring pattern 132, and the lower wiring via 133 will be omitted. The lower substrate portion 130 may have a symmetrical structure with the upper substrate portion 120, with respect to the core substrate portion 110. For example, both of the lower wiring via 133 and the upper wiring via 123 may have a tapered shape whose width decreases toward the core substrate portion 110. Accordingly, the lower wiring via 133 and the upper wiring via 123 may have a shapes tapered in opposite directions to each other.

An upper cover layer 140A and a lower cover layer 140B may be disposed on the upper substrate portion 120 and the lower substrate portion 130, respectively. The upper cover layer 140A may have an opening exposing at least a portion of the upper wiring pattern 122 on the uppermost side thereof, and the lower cover layer 140B may have an opening exposing at least a portion of the lower wiring pattern 132 on the lowermost side thereof. The upper cover layer 140A and the lower cover layer 140B may include one of the above-described insulating materials. For example, the upper cover layer 140A and the lower cover layer 140B may include a solder resist.

Hereinafter, a modified example of the base substrate 100 will be described with reference to FIGS. 2A and 2B. FIGS. 2A and 2B only illustrate a partial area of the base substrate 100 of FIG. 1A.

Referring to FIG. 2A, in a modified example, the base substrate 100a may further include a connection conductor 150 disposed on the upper substrate portion 120. The connection conductor 150 may be connected to the upper wiring pattern 122 exposed through an opening of the upper cover layer 140A. As the connection conductor 150, a conductive post or a solder ball may be used. The connection conductor 150 may improve connection reliability of the interposer substrate 200 to improve a yield of the semiconductor package 1000A.

Referring to FIG. 2B, in a modified example, the base substrate 100b may not include the core substrate portion 110 and the lower substrate portion 130. The base substrate 100b may include only the upper substrate portion 120 stacked in one direction (Y-axis direction), and a lower substrate pad 132P and a lower via 132C connecting the lower substrate pad 132P to an upper wiring pattern 122 may be formed on the lower surface of the upper substrate portion 120. The base substrate 100 may have various structures in addition to the structures shown in FIGS. 1A, 2A, and 2B. A substrate having an area of 40 mm or more in each of the horizontal and vertical directions may be used, without limitations, as the base substrate 100 of an example embodiment.

Hereinafter, an interposer substrate 200 will be described with reference to FIGS. 3A and 3B together with FIGS. 1A to 1C. FIGS. 3A and 3B illustrate an upper redistribution pattern 222 of the interposer substrate 200 disposed on an X-Y plane.

The interposer substrate 200 may be disposed on an upper surface 100S1 of the base substrate 100, and may have an upper surface 200S1 and a lower surface 200S2, disposed opposite to each other. The interposer substrate 200 may include a lower redistribution structure 210, adjacent to the base substrate 100, and an upper redistribution structure 220 disposed on an upper surface of the lower redistribution structure 210. The interposer substrate 200 may further include a protective insulating layer 230 disposed on a lower surface of the lower redistribution structure 210.

The lower redistribution structure 210 may include at least one of a lower insulating layer 211, a lower redistribution pattern 212 disposed on both surfaces of the lower insulating layer 211, and a lower redistribution via 213 penetrating through the at least one of the lower insulating layer 211 and interconnecting the lower redistribution patterns in different layers.

The lower insulating layer 211 may include an insulating material. For example, the insulating material may include a thermosetting resin such as epoxy resin, a thermoplastic resin such as polyimide, or a resin in which inorganic fillers and/or glass fibers (Glass Fiber, Glass Cloth, Glass Fabric) are mixed with the above-mentioned resin. For example, an Ajinomoto build-up film (ABF), prepreg, or the like, may be used. The lower insulating layer 211 may have a single layer or a multilayer structure. For example, referring to the drawings, the lower insulating layer 211 may have a form in which a plurality of the lower insulating layer 211 (e.g., two layers) are stacked. In this case, the lower redistribution pattern 212 may be provided as a plurality of the lower redistribution pattern 212 (e.g., three layers), disposed on different levels. For example, referring to the drawings, the uppermost one of the plurality of the lower redistribution pattern 212 (e.g., three layers), may be buried in the upper surface of the uppermost one of the plurality of the lower insulating layer 211 (e.g., two layers), the middle one of the plurality of the lower redistribution pattern 212 may be disposed on a lower surface of the uppermost one of the plurality of the lower insulating layer 211, and the lowermost one of the plurality of the lower redistribution pattern 212 may be disposed on a lower surface of the lowermost one of the plurality of the lower insulating layer 211, covering the middle one of the plurality of the lower redistribution pattern 212. In this case, the upper surface of the uppermost one of the plurality of the lower insulating layer 211 and the upper surface of the uppermost one of the plurality of the lower redistribution pattern 212 may be substantially coplanar.

The lower redistribution pattern 212 may be electrically connected to the core wiring pattern 112, the upper wiring pattern 122, and the lower wiring pattern 132 through the lower connection bump 21. The lower redistribution pattern 212 may be disposed on the lower insulating layer 211, and may be a plurality of the lower redistribution pattern 212 disposed on different levels. The lower redistribution pattern 212 on the lowermost side among the plurality of the lower redistribution pattern 212 may include a lower connection pad 212P1 at least partially exposed by an opening 230H of the protective insulating layer 230. At least a portion of the lower surface of the lower connection pad 212P1 may be covered by the protective insulating layer 230. Accordingly, the lower connection pad 212P1 may be disposed on a higher level than the lower surface 200S2 of the interposer substrate 200.

The lower redistribution pattern 212 may include at least one of the above-described conductive materials. Like the wiring pattern of the base substrate 100, the lower redistribution pattern 212 may include a ground pattern, a power pattern, and a signal pattern. The lower redistribution pattern 212 may be formed by a plating process, and may include a seed layer and a conductive layer on the seed layer.

The lower redistribution via 213 may penetrate through the lower insulating layer 211 and electrically connect the plurality of the lower redistribution pattern 212 formed in different layers. The lower redistribution via 213 may include a conductive material similar to the lower redistribution pattern 212. The lower redistribution via 213 may be a filled-type via in which a via hole penetrating the lower insulating layer 211 is filled with a metal material, or a conformal-type via formed along a wall surface of the via hole.

The upper redistribution structure 220 may include at least one of the upper insulating layer 221, an upper redistribution pattern 222 respectively disposed on the at least one of the upper insulating layer 221, and an upper redistribution via 223 penetrating through the at least one of the upper insulating layer 221 and interconnecting a plurality of the upper redistribution pattern 222 of different layers or connecting a lowermost one of the at least one of the upper redistribution pattern 222 to an uppermost one of the at least one of the lower redistribution pattern 212.

The upper insulating layer 221 may include an insulating material, for example, a photosensitive resin such as a photoimageable dielectric (PID) resin. In this case, the upper insulating layer 221 may be formed to be thinner, and the upper redistribution via 223 may be formed more finely. The upper insulating layer 221 may have a single layer or multilayer structure. For example, referring to the drawings, the at least one of the upper insulating layer 221 may be a plurality of the upper insulating layer 221 (e.g., three layers) that are stacked. In this case, the upper redistribution pattern 222 may be provided as a plurality of the upper redistribution pattern 222 (e.g., two or three layers) disposed on different levels. For example, referring to the drawings, the lowermost one of the plurality of the upper redistribution pattern 222 (e.g., three layers), may be disposed on the upper surface of the lowermost one of the plurality of the upper insulating layer 221 (e.g., three layers), and the middle one of the plurality of the upper redistribution pattern 222 may be disposed on the upper surface of the middle one of the plurality of the upper insulating layer 221, and the uppermost one of the plurality of the upper redistribution pattern 222 may be disposed on the upper surface of the uppermost one of the plurality of the upper insulating layer 221. In this case, the uppermost one of the plurality of the upper redistribution pattern 222 may be an upper connection pad 222P1 in a form of a post electrode, and the plurality of the upper redistribution pattern 222 may include two of redistribution patterns (e.g., two layers), substantially on the lower layer and the middle layer. Depending on the process, a boundary between the plurality of the upper insulating layer 221 of different levels may be unclear.

The upper redistribution pattern 222 may be a plurality of the upper redistribution pattern 222 electrically connected to the lower redistribution pattern 212 and disposed on different levels. The upper redistribution pattern 222 on the uppermost side among the plurality of the upper redistribution pattern 222, may include an upper connection pad 222P1 protruding further from the upper surface 200S1 of the interposer substrate 200.

Referring to FIG. 3A together with FIG. 1C, at least one upper redistribution pattern 222c disposed below an upper connection pad 222P1 may include at least one landing pad 222P2 connected to another upper redistribution pattern below the at least one upper redistribution pattern 222c or an upper connection pad 222P1 through the upper redistribution via 223. The landing pad 222P2 may be overlapped by the upper connection pad 222P1 in a vertical direction (Z-axis direction). A maximum width d1 of the upper connection pad 222P1 may be smaller than a maximum width d2 of the landing pad 222P2. For example, the maximum width of the upper connection pad 222P1 may be in a range of about 40 μm to 50 μm, and the maximum width of the landing pad 222P2 may be in a range of about 50 μm to 60 μm. The upper connection pad 222P1 may include a body layer 222P1a integrally formed with the upper redistribution via 223, and a barrier layer 222P1b disposed on the body layer 222P1a, and a thickness of the barrier layer 222P1b may be smaller than a thickness of the body layer 222P1a. The body layer 222P1a may have a single layer structure including copper (Cu) or nickel (Ni), and the barrier layer 222P1b may have a single layer or multilayer structure including nickel (Ni) and/or gold (Au). The barrier layer 222P1b may function to prevent diffusion between the upper connection bump 31 and the body layer 222P1a.

Like the lower redistribution via 213, the upper redistribution via 223 may be a filled-type via or a conformal-type via. The lower redistribution via 213 may be formed by forming a via hole by, for example, a photolithography process and filling a metal material by a plating process.

The upper redistribution structure 220 and the lower redistribution structure 210 may be stacked in opposite directions with respect to the boundary line bs between the upper insulating layer 221 and the lower insulating layer 211. For example, the upper redistribution structure 220 may be stacked in a +Z-axis direction based on the boundary line bs, and the lower redistribution structure 210 may be stacked in a −Z-axis direction based on the boundary line bs. Accordingly, the plurality of the lower redistribution pattern 212 and the plurality of the upper redistribution pattern 222 may protrude in opposite directions based on the boundary line bs between at least one of the lower insulating layer 211 and at least one of the upper insulating layer 221. In addition, the lower redistribution via 213 and the upper redistribution via 223 may have shapes tapered in opposite directions to each other.

The semiconductor chip 300 having high performance mounted on a large-area package substrate may have a plurality of a connection pad 302 integrated with a fine pitch, and for a package substrate corresponding thereto, a wiring of a fine pitch or a redistribution circuit may be used. In an example embodiment of the present disclosure, a core wiring pattern 112, an upper wiring pattern 122, and a lower wiring pattern (also referred to as a 'wiring pattern') of the base substrate 100 and a lower redistribution pattern 212 and an upper redistribution pattern 222 of the interposer substrate 200 may have different line and space standards. Accordingly, the semiconductor package 1000A according to an example embodiment may implement a line and space corresponding to the semiconductor chip 300 having high performance and may be manufactured at a high yield, such that a product cost may be significantly reduced.

In an example embodiment, the core wiring pattern 112, the upper wiring pattern 122, the lower wiring pattern 132, the lower redistribution pattern 212, and the upper redistribution pattern 222 may have a predetermined line and space standard, respectively. The line and space of the core wiring pattern 112, the upper wiring pattern 122, and the lower wiring pattern 132 may be 40 μm or more and 40 μm or more, the line and space of the lower redistribution pattern 212 may be 7 μm or more and 10 μm or more, and the line and space of the upper redistribution pattern 222 may be 5 μm or more and 5 μm or more. According to an example embodiment, it is possible to implement the line and space corresponding to a semiconductor chip having high performance by minimizing pattern formation of the fine pitch, lowering the yield of the product, and adjusting the line and space gradually.

Hereinafter, lines and spaces of the core wiring pattern 112, the upper wiring pattern 122, and the lower wiring pattern 132, the lower redistribution pattern 212, and the upper redistribution pattern 222 will be described with reference to FIG. 3B. FIG. 3B illustrates a pair of a first upper redistribution pattern 222a and a second upper redistribution pattern 222b extending in a first direction (X-axis direction) on an X-Y plane and adjacent to each other in a second direction (Y-axis direction).

Referring to FIG. 3B, the line (L) and space (S) may be defined as a line width L of the metal wiring (or redistribution pattern) and a distance (or a 'spacing distance') (S) between the wirings, adjacent to each other. For example, when a portion of each of the pair of the first upper redistribution pattern 222a and the second upper redistribution pattern 222b, adjacent to each other, extends in the first direction (X-axis direction), the line width L of the first upper redistribution pattern 222a or the second upper redistribution pattern 222b in the second direction (Y-axis direction) may be in a range of about 5 μm to 10 μm, and the space S between the first upper redistribution pattern 222a and the second upper redistribution pattern 222b in the second direction (e.g., Y-axis direction) may be in a range of about 5 μm to 10 μm.

Similarly, when a portion of each of a pair of the lower redistribution pattern 212, adjacent to each other, extends in the first direction (X-axis direction), the line width L of the lower redistribution pattern 212 in the second direction (Y-axis direction) may be in a range of about 7 μm to 20 μm, and the distance S between the pair of the lower redistribution pattern 212 in the second direction (e.g., Y-axis direction) may be in a range of about 10 μm to 20 μm.

Similarly, when the core wiring pattern 112, the upper wiring pattern 122, and the lower wiring pattern 132 extend in the first direction (X-axis direction), the line width L of each of the wiring patterns in the second direction (Y-axis direction) may be in a range of about 40 μm to 70 μm, and a distance S between a pair from among the core wiring pattern 112, the upper wiring pattern 122, and the lower wiring pattern 132 disposed on the same level and adjacent to each other in the second direction (Y-axis direction), may be in a range of 40 μm to 70 μm.

In addition, in an example embodiment, sizes of the lower redistribution via 213 and the upper redistribution via 223 in the interposer substrate 200 may be different. A diameter of the upper redistribution via 223 may be smaller than a diameter of the lower redistribution via 213. For example, a maximum diameter of the lower redistribution via 213 may be in a range of about 60 μm to 80 μm, and a maximum diameter of the upper redistribution via 223 may be in a range of about 10 μm to 30 μm.

The semiconductor package 1000A may further include an external connection bump 11, a lower connection bump 21, and an upper connection bump 31 (also referred to as a "connection bump"). The external connection bump 11 may be disposed on the lower surface 100S2 of the base substrate 100 and may be electrically connected to the core wiring pattern 112, the upper wiring pattern 122, and the lower wiring pattern 132. The lower connection bump 21 may be disposed between the base substrate 100 and the interposer substrate 200 and may connect the core wiring pattern 112, the upper wiring pattern 122, and the lower wiring pattern 132, with the lower redistribution pattern 212. The upper connection bump 31 may be disposed between the semiconductor chip 300 and the interposer substrate 200 and may connect the connection pad 302 of the semiconductor chip 300 and the upper redistribution pattern 222. The connection bumps may have a flip-chip connection structure, having a solder ball, a conductive bump, or a grid array such as a pin grid array, a ball grid array, and a land grid array.

According to embodiments of the present disclosure, a bump pitch for connecting the semiconductor chip 300, that is high performance, can be implemented by changing the line and space of the wiring pattern, the lower redistribution pattern, and the upper redistribution pattern, gradually. For example, a distance between a pair of the external connection bump 11, adjacent to each other, is in a range of about 0.8 mm to 1.5 mm, a distance between a pair of the lower connection bump 21, adjacent to each other, is in a range of about 0.1 mm to 0.7 mm, and a distance between a pair of the upper connection bump 31, adjacent to each other, may be in a range of about 50 μm to 150 μm. The lower connection bump 21 and the upper connection bump 31 may be protected by a lower underfill resin 22 and upper underfill resin 32 including an epoxy resin, respectively.

In an example embodiment, when an electrical signal passes through the core wiring pattern 112, the upper wiring pattern 122, the lower wiring pattern 132, the lower redistribution pattern 212, the upper redistribution pattern 222, the external connection bump 11, the lower connection bump 21, and the upper connection bump 31, an impedance mismatch may occur. Accordingly, the core wiring pattern 112, the upper wiring pattern 122, and the lower wiring pattern 132 may include an impedance matching circuit for compensating for an impedance mismatch of an electric signal. The impedance matching circuit may be included in the lower wiring pattern 132 and/or the core wiring pattern 112 disposed on a relatively lower layer in order to increase the length of the transmission line.

The protective insulating layer 230 may be disposed on another surface, opposite of one surface of the lower insulating layer 211 on which the upper insulating layer 221 is disposed. The protective insulating layer 230 may cover at least a portion of a lowermost one from among the plurality of the lower redistribution pattern 212. The protective insulating layer 230 may include, for example, a thermosetting resin such as an epoxy resin, a thermoplastic resin such as polyimide, or an insulating resin such as a resin in which inorganic fillers and/or glass fibers are mixed with these resins. The protective insulating layer 230 may include an insulating resin, different from the lower insulating layer 211 and the upper insulating layer 221. For example, the protective insulating layer 230 may include ABF, the lower insulating layer 211 may include a prepreg, and the upper insulating layer 221 may include a PID.

Hereinafter, a manufacturing process of the interposer substrate 200 will be described with reference to FIGS. 4A to 4D. 4A to 4D are cross-sectional diagrams schematically illustrating a manufacturing process of the interposer substrate 200 of FIGS. 1A and 1C.

Figure 4A:
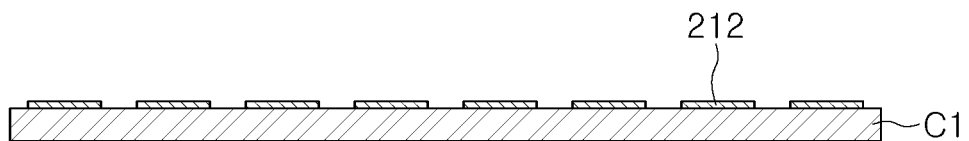
FIG. 4A is a first cross-sectional diagram schematically illustrating a manufacturing process of the interposer substrate of FIGS. 1A and 1C.

Referring to FIG. 4A, a lower redistribution pattern 212 may be formed on the first carrier C1. The lower redistribution pattern 212 illustrated in FIG. 4A may correspond to an uppermost lower redistribution pattern, adjacent to a "bs" line of FIG. 1C. The lower redistribution pattern 212 may be formed by a plating process and an etching process.

Figure 4B:
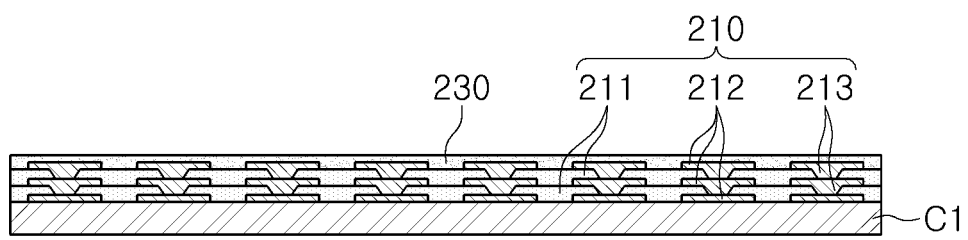
FIG. 4B is a second cross-sectional diagram schematically illustrating the manufacturing process of the interposer substrate of FIGS. 1A and 1C.

Referring to FIG. 4B, a plurality of a lower insulating layer 211, a plurality of a lower redistribution via 213, and a plurality of a lower redistribution pattern 212 may be formed on the lower redistribution pattern 212 of FIG. 4A. For example, as shown in the drawing, two layers of the lower insulating layer 211, three layers of the lower redistribution pattern 212, and two layers of the lower redistribution via 213 may be formed. The lower insulating layer 211 may be formed by laminating an insulating film and then curing it. The lower insulating layer 211 may be formed using, for example, a prepreg. A protective insulating layer 230 may be formed on the lower redistribution pattern 212 protruding from the uppermost one from among a plurality of the lower insulating layer 211 with reference to FIG. 4B. The protective insulating layer 230 may also be formed using an insulating film. For example, the protective insulating layer 230 may be formed using ABF.

Figure 4C:
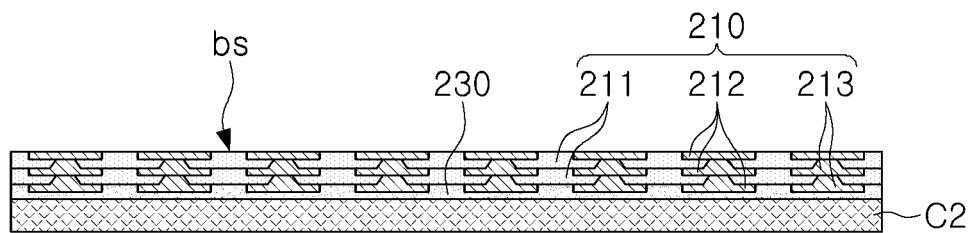
FIG. 4C is a third cross-sectional diagram schematically illustrating the manufacturing process of the interposer substrate of FIGS. 1A and 1C.

Referring to FIG. 4C, after removing the first carrier C1 of FIG. 4B, the lower redistribution structure 210 may be turned over and attached to a second carrier C2. In FIG. 4B, a surface facing the first carrier C1 may be a boundary line bs with the upper redistribution structure 220 to be formed later. Referring to FIG. 4C, the upper surface of the uppermost one of the plurality of the lower redistribution pattern 212 and the upper surface of the uppermost one of the plurality of the lower insulating layer 211 may be coplanar with each other.

Figure 4D:
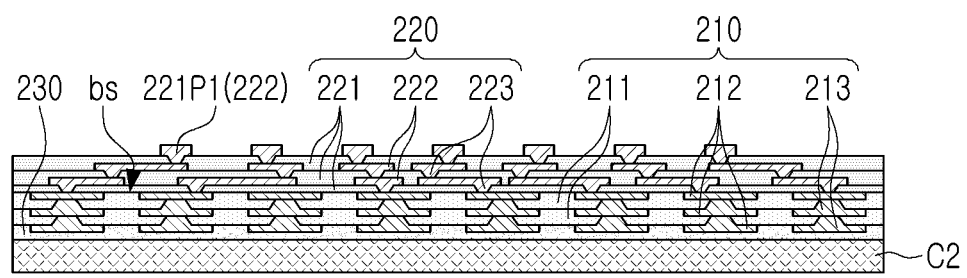
FIG. 4D is a fourth cross-sectional diagram schematically illustrating the manufacturing process of the interposer substrate of FIGS. 1A and 1C.

Referring to FIG. 4D, a plurality of a upper insulating layer 221, a plurality of a upper redistribution pattern 222, and a plurality of an upper redistribution via 223 may be formed on the lower redistribution structure 210. In the drawing, the upper connection pad 221P1 protruding from the uppermost one the plurality of the upper insulating layer 221 and the via connecting the same to the upper redistribution pattern 222 may not be included. For example, as shown in the drawing, three layers of the upper insulating layer 221, two layers of the upper redistribution pattern 222, and two layers of the upper redistribution via 223 may be formed. Thereafter, the second carrier C2 may be removed and an opening for exposing a lowermost one of the plurality of the lower redistribution pattern 212 from the protective insulating layer 230 may be formed. The opening of the protective insulating layer 230 may also be formed after curing the protective insulating layer 230 in FIG. 4B.

As described in FIGS. 4A to 4D, since build-up directions of the lower redistribution structure 210 and the upper redistribution structure 220 are different from each other, a formation direction of the lower redistribution pattern 212 and the upper redistribution pattern 222 may be opposing each other. For example, a protruding direction of the lower redistribution pattern 212 and the upper redistribution pattern 222 may be opposite to each other, based on the boundary line bs between the lower insulating layer 211 and the upper insulating layer 221. Similarly, tapering directions of the lower redistribution via 213 and the upper redistribution via 223 may be opposite to each other.

The semiconductor chip (or the semiconductor structure) 300 may be disposed on the upper surface 200S1 of the interposer substrate 200, and may include a connection pad 302 electrically connected to the upper redistribution pattern 222. The semiconductor chip 300 may be an integrated circuit (IC) chip in which a plurality of ICs are formed on a wafer 301. The semiconductor chip 300 may include a logic chip such as a central processor (CPU), a graphics processor (GPU), a field programmable gate array (FPGA), a digital signal processor, a cryptographic processor, a microprocessor, a microcontroller, an analog-digital converter, an application-specific IC (ASIC), a serializer and deserializer IC (SerDes IC) including a high speed serial-parallel conversion circuit, or a volatile memory chip such as a dynamic RAM (DRAM), a static RAM (SRAM), and the like, or a non-volatile memory chip such as a phase change RAM (PRAM), a magnetic RAM (MRAM), a resistive RAM (RRAM), a flash memory, and the like.

The heat dissipation structure 400 may be disposed on the upper surface 100S1 of the base substrate 100, and may cover the interposer substrate 200 and the semiconductor chip 300. The heat dissipation structure 400 may be attached to the base substrate 100 by an adhesive. As the adhesive, a thermally conductive adhesive tape, a thermally conductive grease, a thermally conductive adhesive, or the like may be used. The heat dissipation structure 400 may be in close contact with the semiconductor chip 300 by an adhesive member 303 (e.g., an adhesive) on the upper surface of the semiconductor chip 300. The heat dissipation structure 400 may include a conductive material having excellent thermal conductivity. For example, the heat dissipation structure 400 may include a conductive material such as metal or a metal alloy containing gold (Au), silver (Ag), copper (Cu), iron (Fe), or the like, or graphite, graphene, or the like. The heat dissipation structure 400 may have a shape, different from that shown in the drawings, and may be omitted in other example embodiments. Conversely, the heat dissipation structure 400 may be further included in the example embodiments described later.

Figure 5:
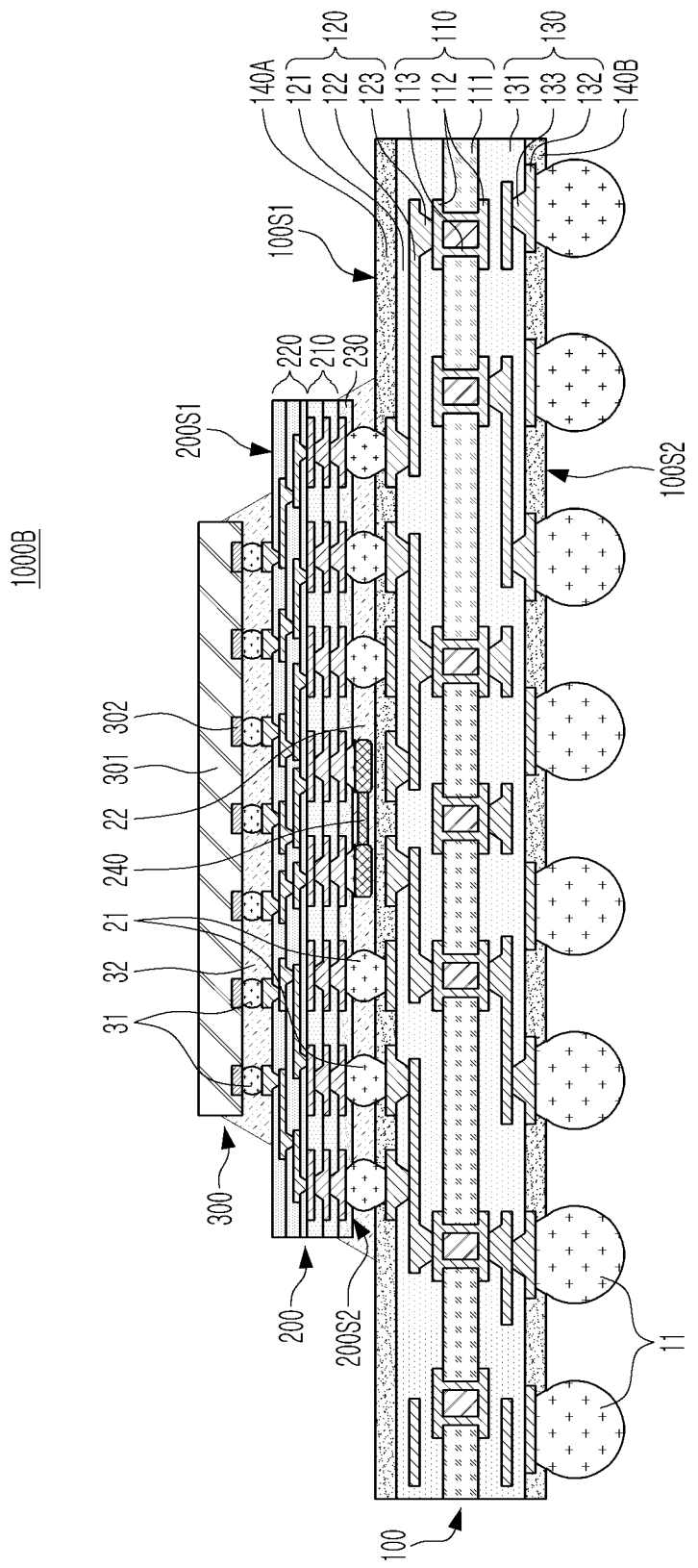
FIG. 5 is a cross-sectional diagram illustrating a semiconductor package according to an example embodiment of the present disclosure.

FIG. 5 is a cross-sectional diagram illustrating a semiconductor package 1000B according to an example embodiment of the present disclosure.

Referring to FIG. 5, the semiconductor package 1000B may further include a passive element 240 disposed on a lower surface 200S2 of the interposer substrate 200 and electrically connected to the lower redistribution pattern 212. The passive element 240 may be disposed in a space between the interposer substrate 200 and the base substrate 100. The passive element 240 may include, for example, a capacitor such as a multi-layer ceramic capacitor (MLCC) or a low inductance chip capacitor (LICC), an inductor, a bead, and the like. In an example embodiment, the passive element 240 may include a Land-Side Capacitor (LSC) disposed between a plurality of the lower connection bump 21. The passive element 240 is attached to the lower surface of the interposer substrate 200, adjacent to the semiconductor chip 300, so that SI (Signal Integrity) and PI (Power Integrity) characteristics may be improved.

Figure 6A:
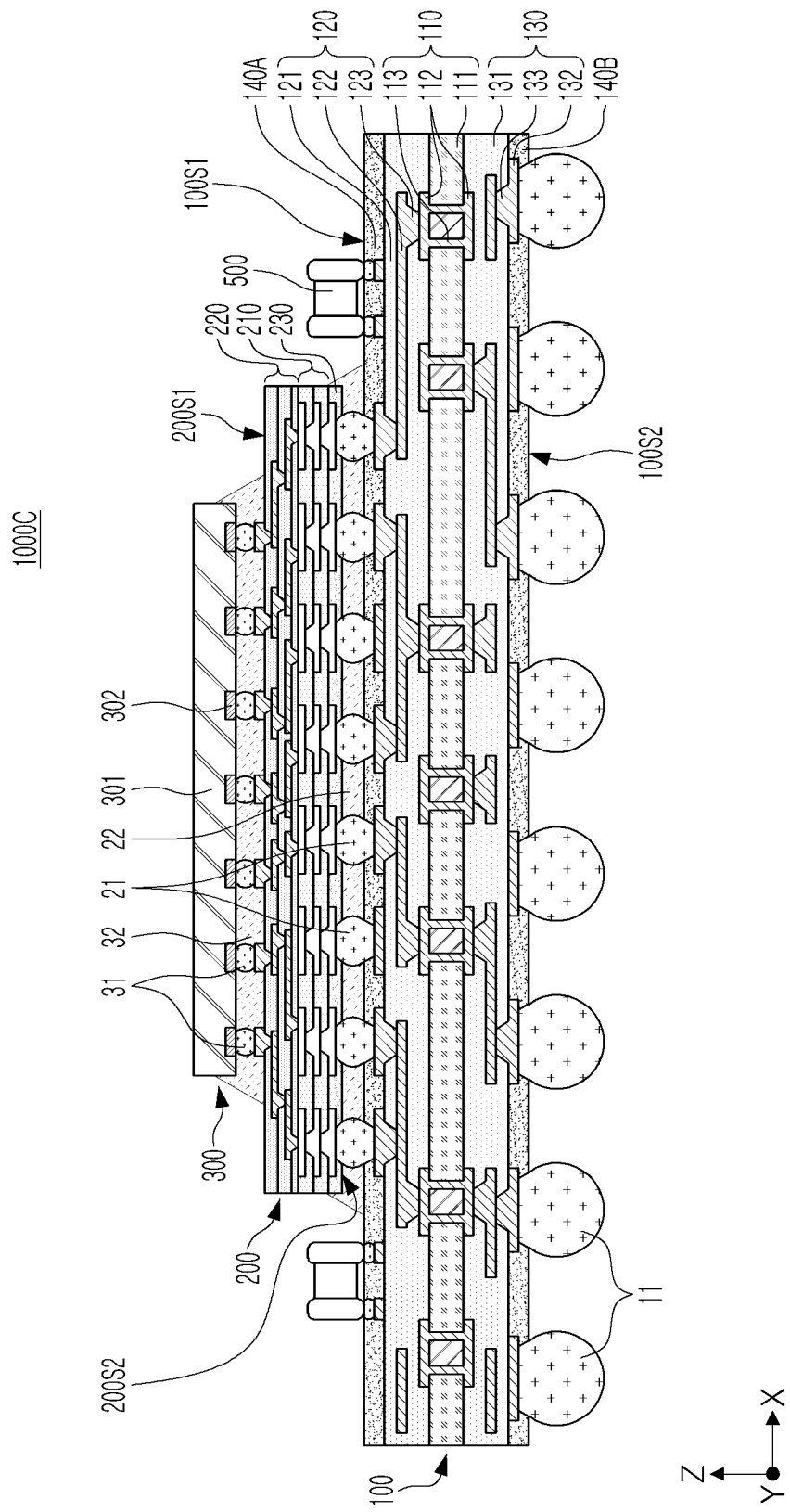
FIG. 6A is a cross-sectional diagram illustrating a semiconductor package according to an example embodiment of the present disclosure.
Figure 6B:
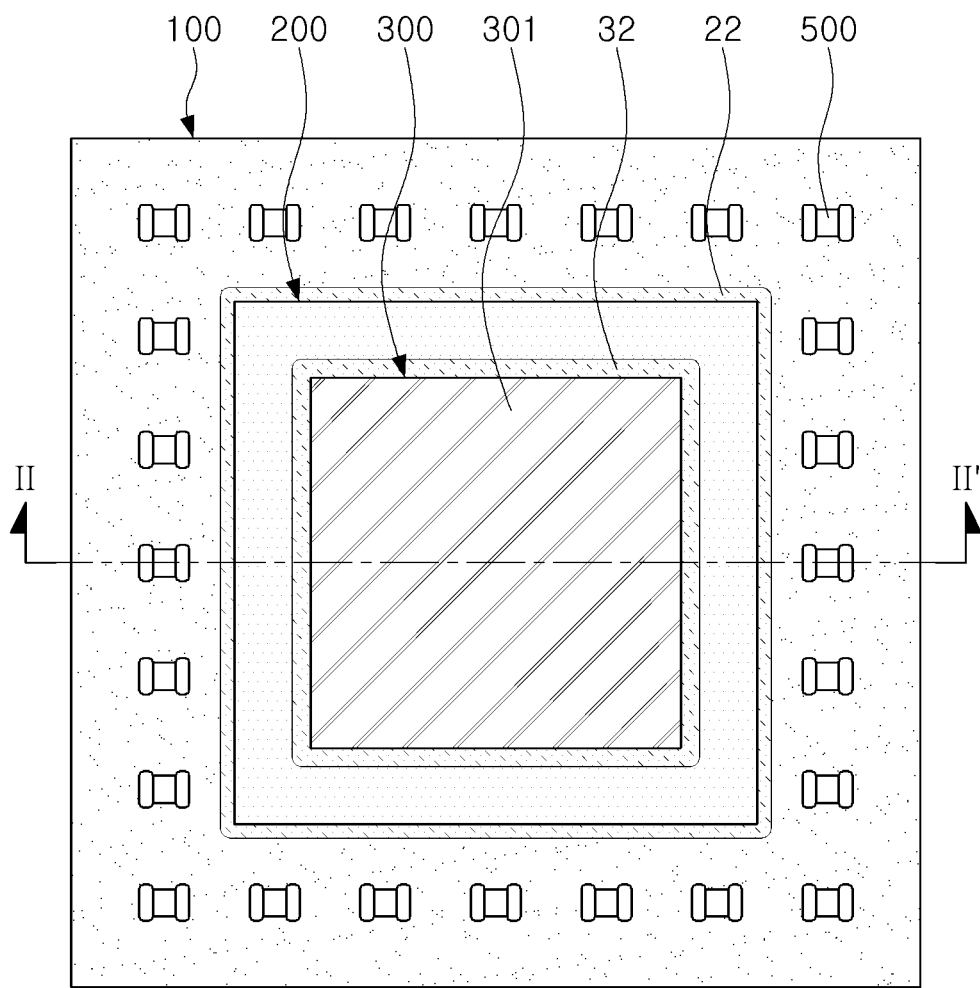
FIG. 6B is a plan diagram illustrating the semiconductor package according to the example embodiment of the present disclosure.

FIGS. 6A and 6B are cross-sectional and plan diagrams illustrating a semiconductor package 1000C according to an example embodiment of the present disclosure. FIG. 6A is a cross-sectional diagram taken along line II-II' of FIG. 6B.

Referring to FIGS. 6A and 6B, the semiconductor package 1000C may further include a plurality of passive elements 500 disposed to be adjacent to the interposer substrate 200 on the upper surface 100S1 of the base substrate 100, and electrically connected to the wiring pattern or the upper wiring pattern 122. The passive elements 500 may include, for example, a capacitor, an inductor, beads, and the like. The passive elements 500 may be mounted on the base substrate 100 in a flip-chip manner. In an example embodiment, when the heat dissipation structure 400 of FIG. 1A is applied, the passive elements 500 may be disposed inside the heat dissipation structure 400. The passive elements 500 may improve SI and PI characteristics.

Figure 7A:
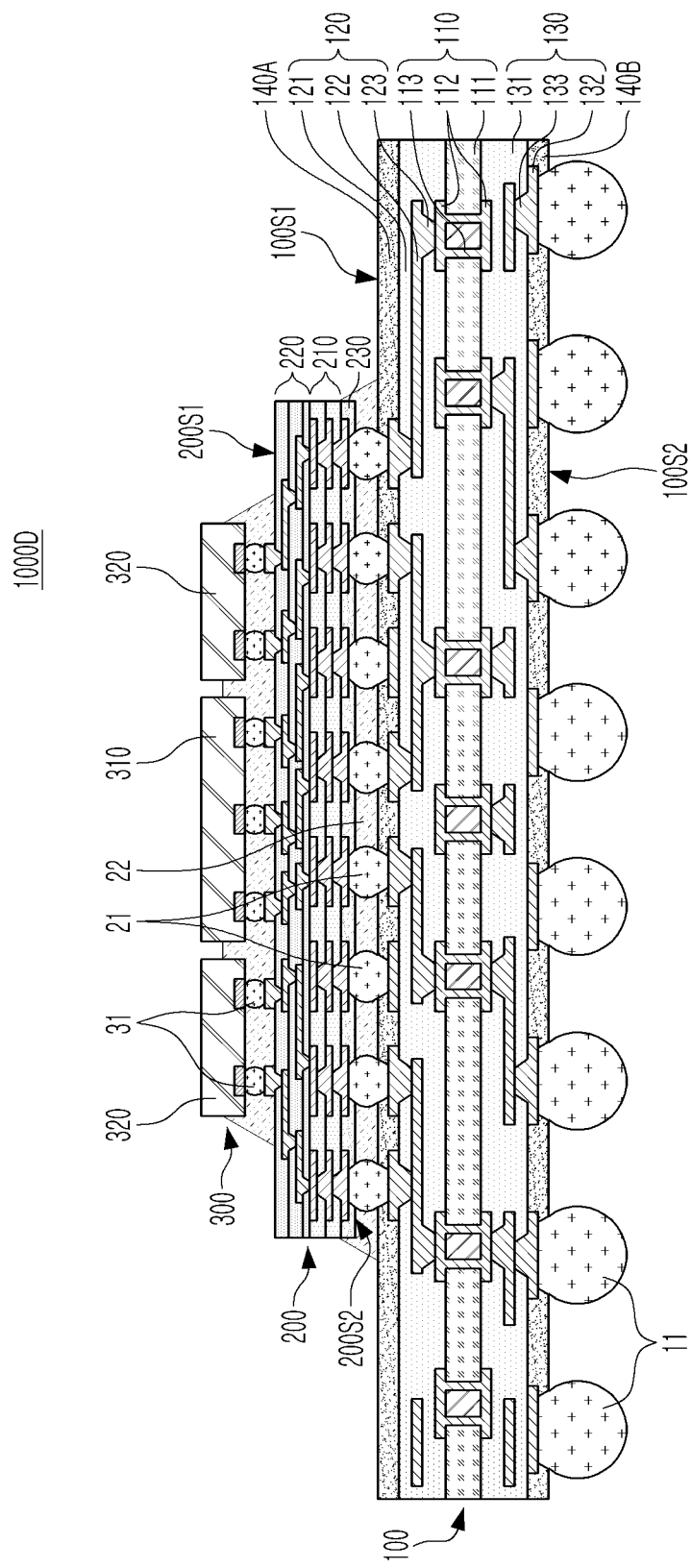
FIG. 7A is a cross-sectional diagram illustrating a semiconductor package according to an example embodiment of the present disclosure.
Figure 7B:
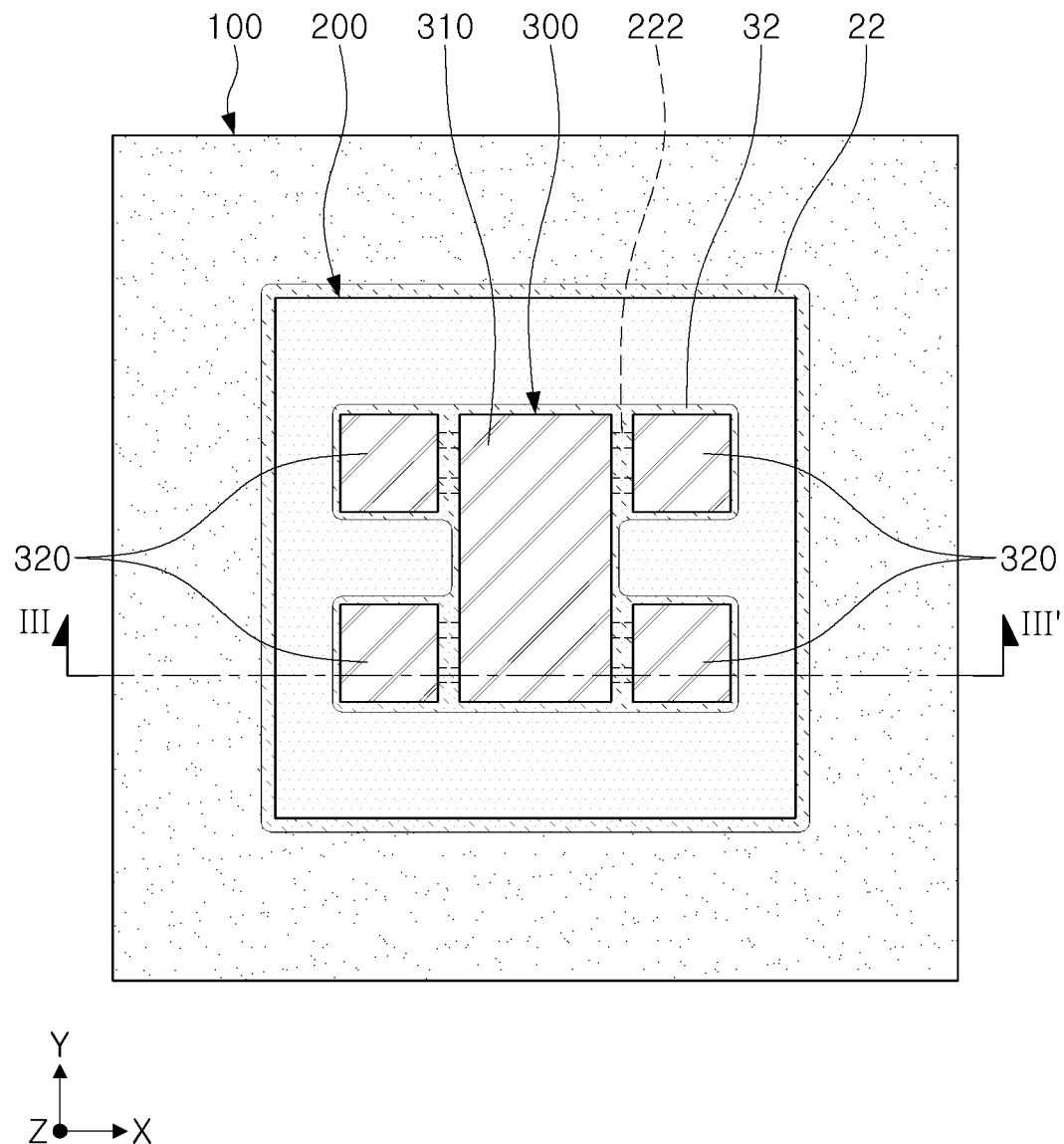
FIG. 7B is a plan diagram illustrating the semiconductor package according to the example embodiment of the present disclosure.

FIGS. 7A and 7B are cross-sectional and plan diagrams illustrating a semiconductor package 1000D according to an example embodiment of the present disclosure. FIG. 7A is a cross-sectional diagram taken along line III-III' of FIG. 7B.

Referring to FIGS. 7A and 7B, in the semiconductor package 1000D, the semiconductor chip 300 may include a first semiconductor structure 310 and a second semiconductor structure 320, spaced apart from each other in a direction (X-axis direction), horizontal to the upper surface 200S1 of the interposer substrate 200. The first semiconductor structure 310 and the second semiconductor structure 320 may be electrically connected to each other through an upper redistribution pattern 222 and an upper redistribution via 223 of the interposer substrate 200. The first semiconductor structure 310 and the second semiconductor structure 320 may include different types of semiconductor chips.

For example, the first semiconductor structure 310 may include an application processor chip such as a CPU, a GPU, a digital signal processor, an encryption processor, a microprocessor a microcontroller, and the like, and a logic chip such as an analog-to-digital converter, an ASIC, and the like, and the second semiconductor structure 320 may include a memory semiconductor such as DRAM, SRAM, flash, PRAM, ReRAM, FeRAM, MRAM, or high bandwidth memory (HBM) or hybrid memory cubic (HMC).

FIGS. 8A to 8E are cross-sectional diagrams schematically illustrating a manufacturing process of the semiconductor package 1000A of FIG. 1.

Figure 8A:
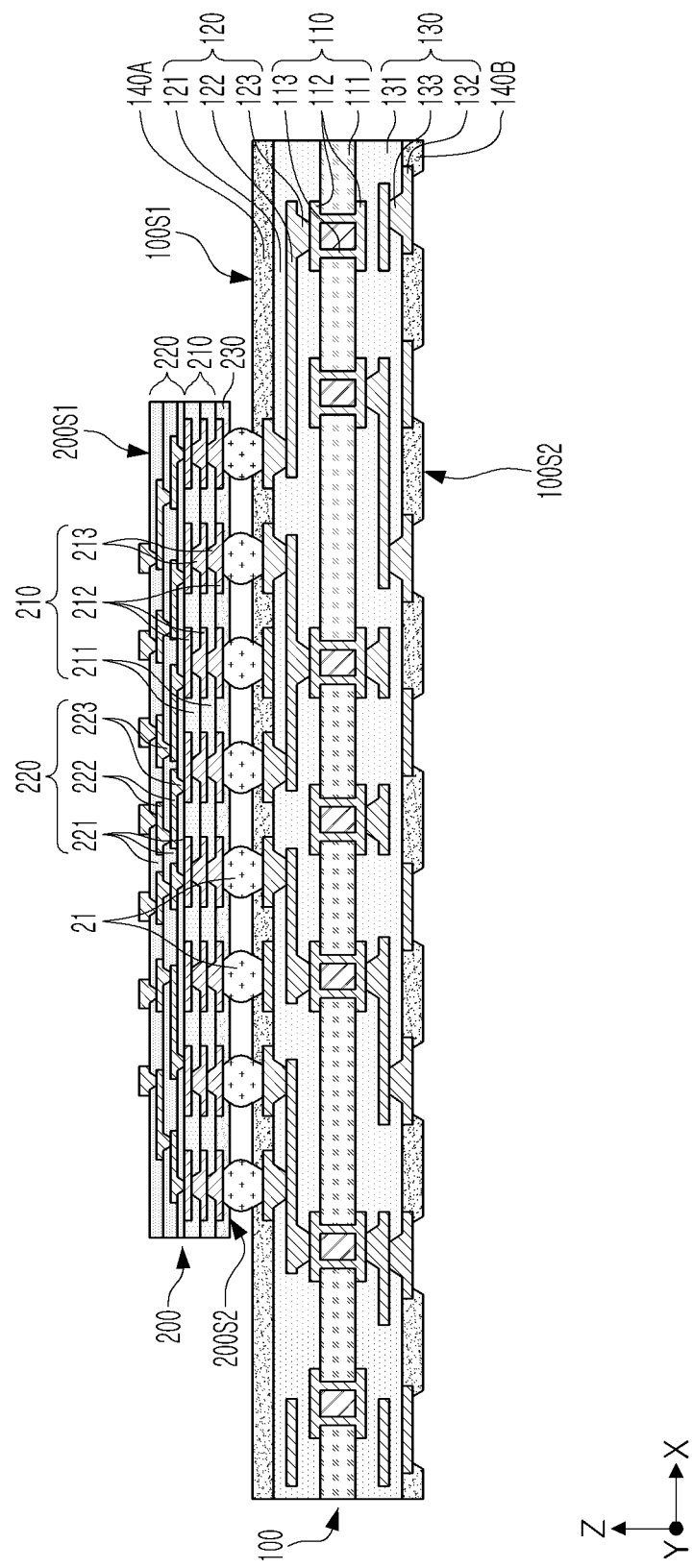
FIG. 8A is a first cross-sectional diagram schematically illustrating a manufacturing process of the semiconductor package of FIG. 1A.

Referring to FIG. 8A, an interposer substrate 200 may be mounted on a base substrate 100. The base substrate 100 may have a horizontal/vertical width of 40 mm or more, and the interposer substrate 200 may have a horizontal/vertical width of 20 mm or more, respectively. The interposer substrate 200 may be attached to the base substrate 100 by a lower connection bump 21, and may be electrically connected to the wiring pattern or the upper wiring pattern 122. The lower connection bump 21 may include a solder ball. The interposer substrate 200 may be attached to the base substrate 100 by a reflow process.

Figure 8B:
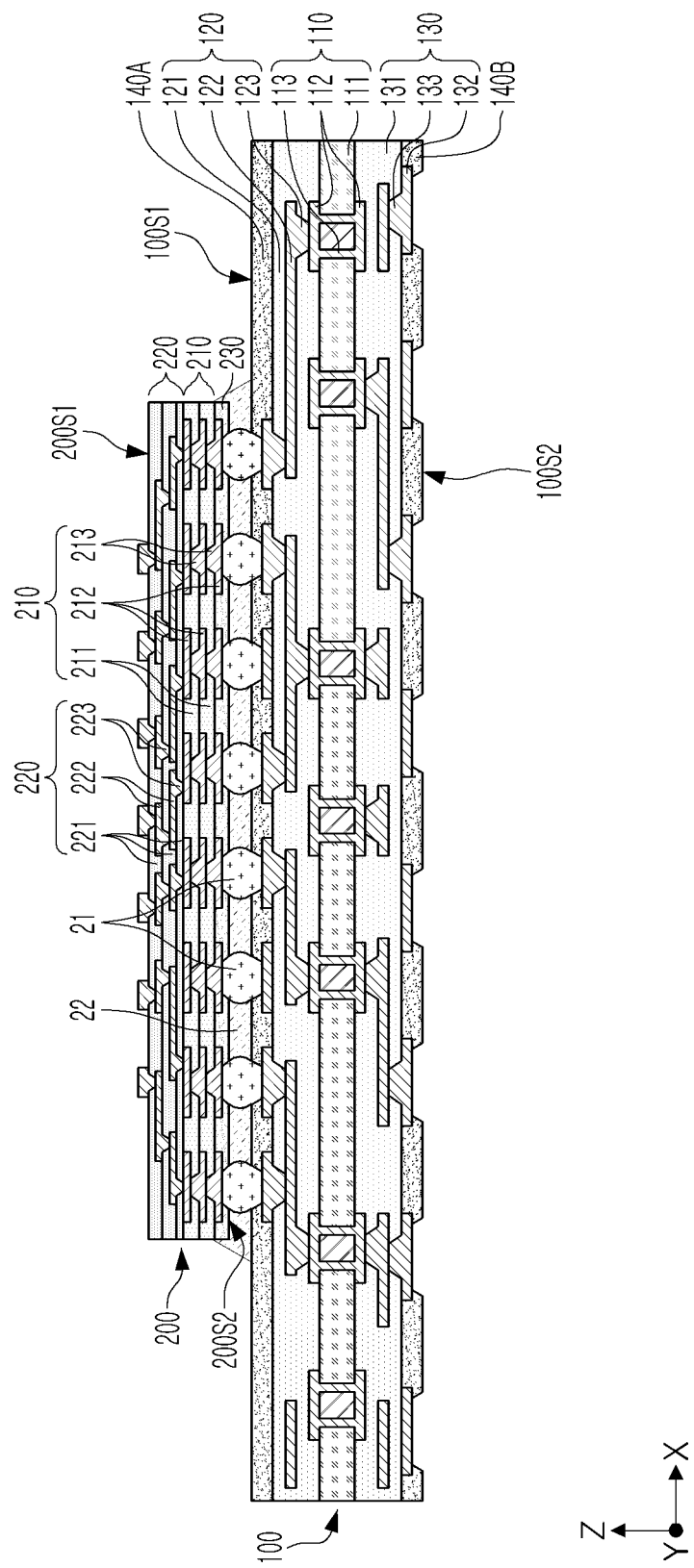
FIG. 8B is a second cross-sectional diagram schematically illustrating the manufacturing process of the semiconductor package of FIG. 1A.

Referring to FIG. 8B, next, a lower underfill resin 22 may be formed between the interposer substrate 200 and the base substrate 100 to protect the lower connection bump 21. The lower underfill resin 22 may be formed by coating an underfill resin material (e.g., an epoxy resin) between the interposer substrate 200 and the base substrate 100 and then curing. The lower underfill resin 22 may be omitted in some cases.

Figure 8C:
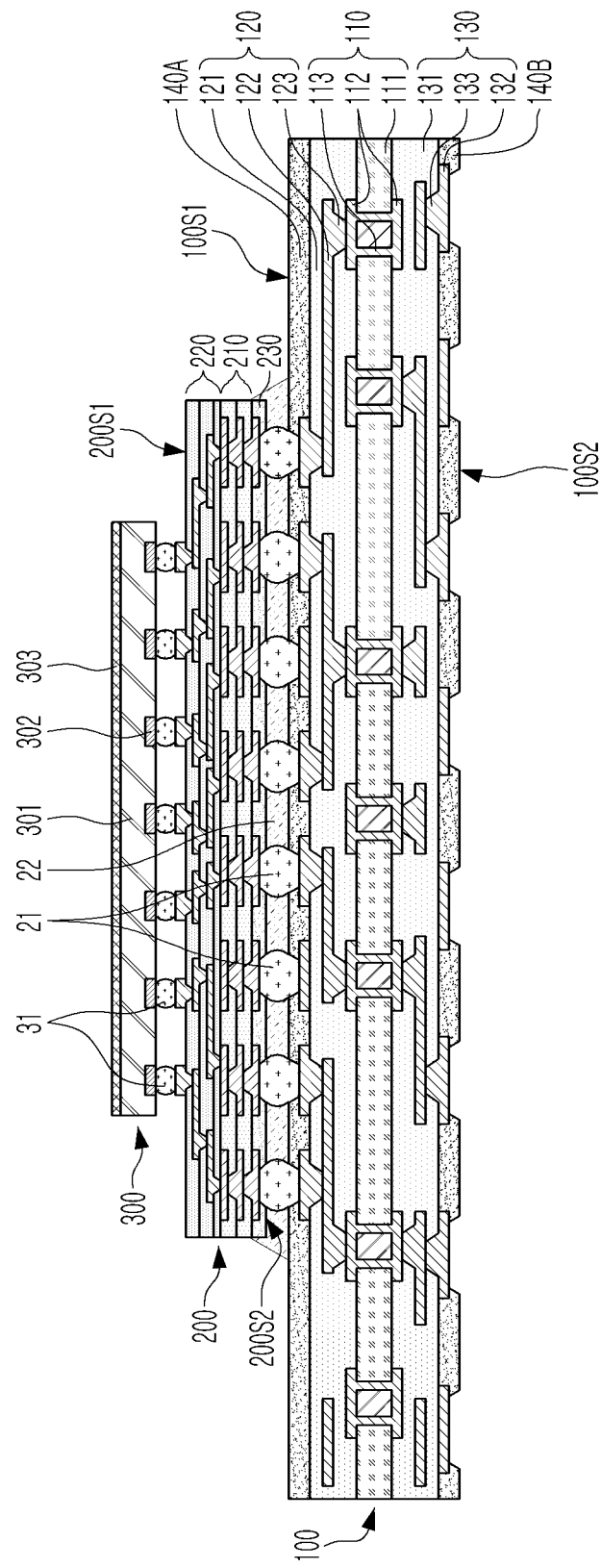
FIG. 8C is a third cross-sectional diagram schematically illustrating the manufacturing process of the semiconductor package of FIG. 1A.

Referring to FIG. 8C, a semiconductor chip 300 may be disposed on the interposer substrate 200. The semiconductor chip 300 may be a logic chip such as an ASIC. The semiconductor chip 300 may be physically and electrically connected to the interposer substrate 200 through an upper connection bump 31. An adhesive member 303 may be disposed on the semiconductor chip 300. The adhesive member 303 may include an adhesive material including an epoxy resin. The adhesive member 303 may also include a material having excellent thermal conductivity.

Figure 8D:
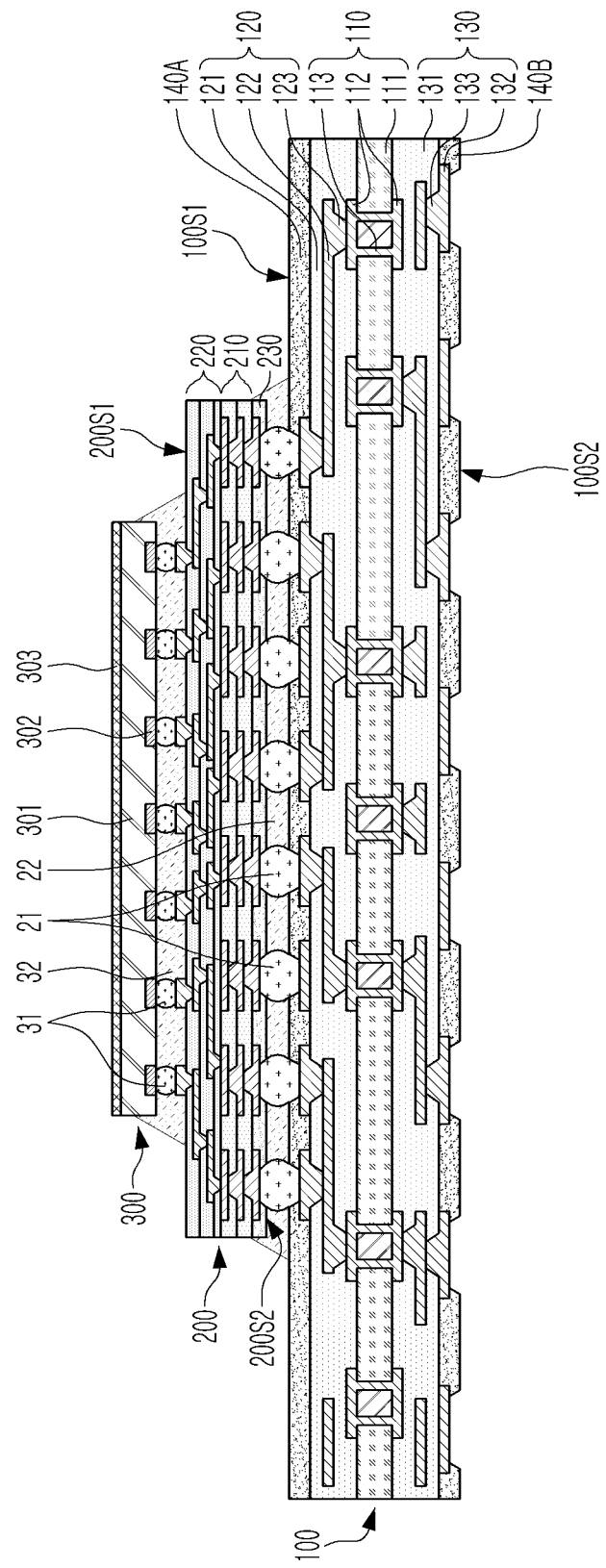
FIG. 8D is a fourth cross-sectional diagram schematically illustrating the manufacturing process of the semiconductor package of FIG. 1A.

Referring to FIG. 8D, an upper underfill resin 32 may be formed between the semiconductor chip 300 and the interposer substrate 200 to protect the upper connection bump 31. The upper underfill resin 32 may be formed of a material and method, similar to the lower underfill resin 22. The upper underfill resin 32 may be omitted in some cases.

Figure 8E:
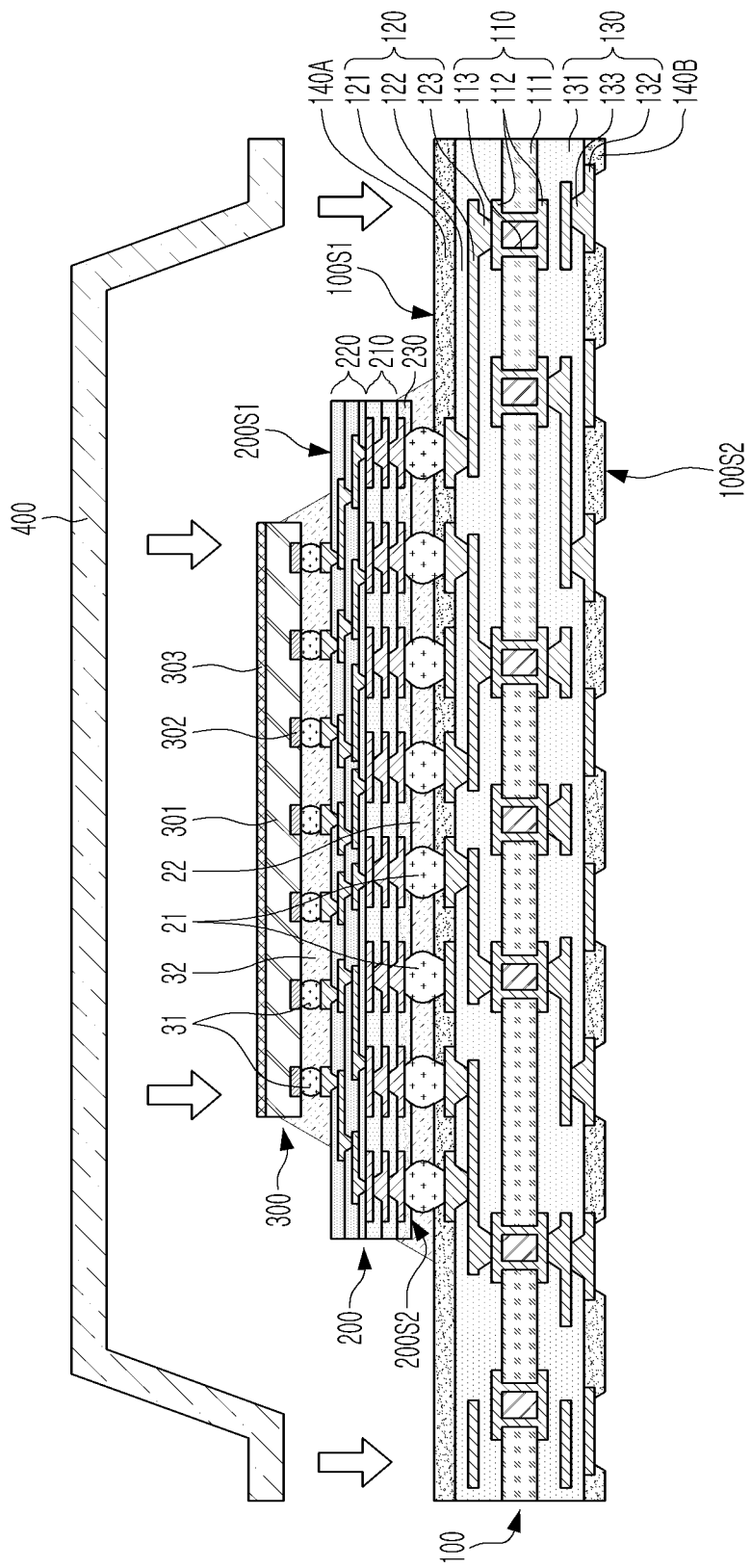
FIG. 8E is a fifth cross-sectional diagram schematically illustrating the manufacturing process of the semiconductor package of FIG. 1A.

Referring to FIG. 8E, a heat dissipation structure 400 covering the interposer substrate 200 and the semiconductor chip 300 may be attached to the base substrate 100. The heat dissipation structure 400 may be attached to the upper surface 100S1 of the base substrate 100 by an adhesive such as an epoxy resin. In addition, the heat dissipation structure 400 may be in close contact with the semiconductor chip 300 by an adhesive member 303. The heat dissipation structure 400 may include a conductive material for heat dissipation and shielding electromagnetic waves.

As set forth above, according to example embodiments of the present disclosure, a semiconductor package having an excellent yield and reduced manufacturing costs may be provided by gradually adjusting the size of redistribution patterns.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present disclosure.

What is claimed is:

1. A method of manufacturing a semiconductor package, comprising:
    forming a lower redistribution structure on a first carrier, the lower redistribution structure including a plurality of lower redistribution patterns having lower connection pads;
    forming a protective insulating layer covering the lower connection pads;
    attaching the lower redistribution structure on a second carrier so that a boundary surface, on which the plurality of lower redistribution patterns is exposed after removing the first carrier, faces upward;
    forming an upper redistribution structure on the boundary surface of the lower redistribution structure, the upper redistribution structure including a plurality of upper redistribution patterns having upper connection pads electrically connected to the lower connection pads, wherein a first width of each of the lower connection pads is greater than a second width of each of the upper connection pads;

forming openings exposing at least a portion of each of the lower connection pads from the protective insulating layer;

disposing an interposer substrate, including the lower redistribution structure and the upper redistribution structure, on a base substrate including a plurality of wiring patterns having lower wiring pads, the lower connection pads of the interposer substrate electrically connected to the plurality of wiring patterns of the base substrate through lower connection bumps disposed on the openings, wherein a third width of each of the lower wiring pads is greater than the first width of each of the lower connection pads; and disposing at least one of semiconductor chips, including connection pads, on the interposer substrate, the connection pads electrically connected to the upper connection pads of the interposer substrate through upper connection bumps.

2. The method of manufacturing the semiconductor package according to claim 1, wherein the second width of each of the upper connection pads is in a range of in a range of 40 μm to 50 μm.

3. The method of manufacturing the semiconductor package according to claim 1, wherein a distance between a pair of lower connection bumps among the lower connection bumps, adjacent to each other, is in a range of 0.1 mm to 0.7 mm.

4. The method of manufacturing the semiconductor package according to claim 1, wherein a distance between a pair of upper connection bumps among the upper connection bumps, adjacent to each other, is in a range of 50 μm to 150 μm.

5. The method of manufacturing the semiconductor package according to claim 1, further comprising, forming external connection bumps on the lower wiring pads of the base substrate,
wherein a distance between a pair of external connection bumps among the external connection bumps, adjacent to each other, is in a range of 0.8 mm to 1.5 mm.

6. The method of manufacturing the semiconductor package according to claim 1,
wherein a line width of the plurality of wiring patterns is in a range of 40 μm to 70 μm,
wherein a line width of the plurality of lower redistribution patterns is in a range of 7 μm to 20 μm, and
wherein a line width of the plurality of upper redistribution patterns is in a range of 5 μm to 10 μm.

7. The method of manufacturing the semiconductor package according to claim 1,
wherein a distance between a pair of lower redistribution patterns, from among the plurality of lower redistribution patterns, adjacent to each other, is in a range of 10 μm to 20 μm, and
wherein a distance between a pair of upper redistribution patterns, from among the plurality of upper redistribution patterns, adjacent to each other, is in a range of 5 μm to 10 μm.

8. The method of manufacturing the semiconductor package according to claim 1,
wherein the lower redistribution structure including a plurality of lower insulating layers, the plurality of lower redistribution patterns disposed on both sides of each of the plurality of lower insulating layers, and a plurality of lower redistribution vias electrically connecting the plurality of lower redistribution patterns to each other, and
wherein the upper redistribution structure including a plurality of upper insulating layers, the plurality of upper redistribution patterns disposed on one side of each of the plurality of upper insulating layers, and a plurality of upper redistribution vias electrically connecting the plurality of upper redistribution patterns to each other, and a lower redistribution pattern and an upper redistribution pattern adjacent to each other, among the plurality of lower redistribution patterns and the plurality of upper redistribution patterns.

9. The method of manufacturing the semiconductor package according to claim 8, wherein the plurality of lower redistribution vias and the plurality of upper redistribution vias have shapes tapered in opposite directions to each other, based on the boundary surface.

10. The method of manufacturing the semiconductor package according to claim 8, wherein the plurality of upper insulating layers includes a photosensitive resin, and
wherein the plurality of lower insulating layers includes a non-photosensitive resin.

11. The method of manufacturing the semiconductor package according to claim 8, wherein a maximum diameter of each lower redistribution via from among the plurality of lower redistribution vias is in a range of 60 μm to 80 μm, and a maximum diameter of each of the plurality of upper redistribution vias is in a range of 10 μm to 30 μm.

12. The method of manufacturing the semiconductor package according to claim 1, further comprising, forming a lower underfill resin between the base substrate and the interposer substrate, after disposing the interposer substrate on the base substrate.

13. The method of manufacturing the semiconductor package according to claim 1, further comprising, forming an upper underfill resin between the interposer substrate and the at least one of semiconductor chips, after disposing the at least one of semiconductor chips on the interposer substrate.

14. The method of manufacturing the semiconductor package according to claim 1, further comprising, disposing a heat dissipation structure on the base substrate, the heat dissipation structure covering the interposer substrate and the at least one of semiconductor chips.

15. The method of manufacturing the semiconductor package according to claim 1, further comprising, forming barrier layers on the upper connection pads, respectively, after forming the upper redistribution structure.

16. The method of manufacturing the semiconductor package according to claim 15, wherein the barrier layers are disposed between the upper connection pads and the upper connection bumps.

* * * * *